United States Patent
Im et al.

(10) Patent No.: US 10,578,273 B2
(45) Date of Patent: Mar. 3, 2020

(54) LIGHTING APPARATUS

(71) Applicant: LG INNOTEK CO., LTD., Seoul (KR)

(72) Inventors: Chang Hyuk Im, Seoul (KR); Sung Do Kim, Seoul (KR); Bu Kwan Je, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/098,197

(22) PCT Filed: Apr. 28, 2017

(86) PCT No.: PCT/KR2017/004543
§ 371 (c)(1),
(2) Date: Nov. 1, 2018

(87) PCT Pub. No.: WO2017/191941
PCT Pub. Date: Nov. 9, 2017

(65) Prior Publication Data
US 2019/0162387 A1    May 30, 2019

(30) Foreign Application Priority Data

May 2, 2016    (KR) .................. 10-2016-0053963

(51) Int. Cl.
*F21V 3/04*    (2018.01)
*H05K 1/03*    (2006.01)
(Continued)

(52) U.S. Cl.
CPC ............... *F21V 3/049* (2013.01); *F21S 8/04* (2013.01); *F21V 3/06* (2018.02); *F21V 23/02* (2013.01);
(Continued)

(58) Field of Classification Search
CPC .. F21V 3/049; F21Y 2107/20; F21Y 2107/30; F21Y 2105/10; F21Y 2105/18
See application file for complete search history.

(56) References Cited

U.S. PATENT DOCUMENTS 5,806,965 A  *   9/1998   Deese ................. B64F 1/20
                                          362/237
2005/0174769 A1* 8/2005   Yong .................. F21V 3/02
                                          362/235
(Continued)

FOREIGN PATENT DOCUMENTS

KR         10-0900887         6/2009
KR      10-2010-0112104      10/2010
(Continued)

OTHER PUBLICATIONS

International Search Report (with English Translation) and Written Opinion dated Jul. 18, 2017 issued in Application No. PCT/KR2017/004543.

*Primary Examiner* — Alexander K Garlen
(74) *Attorney, Agent, or Firm* — KED & Associates, LLP (57) ABSTRACT

An embodiment relates to a light apparatus comprising: a first body having an inner peripheral side and an outer peripheral side; a diffusion member disposed on the first body; a cover disposed on the first body so as to cover the diffusion member; a second body disposed between the diffusion member and the cover and comprising a lower side and a lateral side which covers the lower side; and a light source member comprising a first circuit board, which is disposed on the lower side of the second body, a second circuit board, which covers the lateral side of the second body, at least one first light source which is mounted on the first circuit board so as to face the diffusion member, and at least one second light source which is mounted on the second circuit board so as to face the inner lateral side of the cover.

14 Claims, 7 Drawing Sheets

(51) Int. Cl.
*F21S 8/04* (2006.01)
*F21V 23/02* (2006.01)
*F21V 3/06* (2018.01)
*F21Y 107/00* (2016.01)
*F21Y 107/20* (2016.01)
*F21Y 113/13* (2016.01)
*F21Y 115/10* (2016.01)

(52) U.S. Cl.
CPC ............ *H05K 1/03* (2013.01); *F21Y 2107/00* (2016.08); *F21Y 2107/20* (2016.08); *F21Y 2113/13* (2016.08); *F21Y 2115/10* (2016.08)

(56) References Cited

U.S. PATENT DOCUMENTS

| | | | | |
|---|---|---|---|---|
| 2006/0001384 | A1* | 1/2006 | Tain | F21K 9/00 315/246 |
| 2011/0286200 | A1* | 11/2011 | Iimura | F21V 7/041 362/84 |
| 2012/0033420 | A1 | 2/2012 | Km et al. | |
| 2012/0049732 | A1* | 3/2012 | Chuang | F21V 29/83 315/32 |
| 2012/0051041 | A1 | 3/2012 | Edmond et al. | |
| 2012/0106153 | A1* | 5/2012 | Huang | F21K 9/232 362/249.02 |
| 2013/0135854 | A1* | 5/2013 | Huang | F21K 9/00 362/231 |
| 2014/0022789 | A1* | 1/2014 | Lin | F21K 9/90 362/249.02 |
| 2014/0268771 | A1* | 9/2014 | Heikman | F21V 29/004 362/249.02 |
| 2014/0369038 | A1* | 12/2014 | Tischler | F21V 21/14 362/235 |
| 2015/0267872 | A1* | 9/2015 | Huang | F21K 9/232 362/249.06 |

FOREIGN PATENT DOCUMENTS

| | | |
|---|---|---|
| KR | 10-2011-0000614 | 1/2011 |
| KR | 10-2015-0041318 | 4/2015 |

* cited by examiner

LIGHTING APPARATUS

This application is a U.S. National Stage Application under 35 U.S.C. § 371 of PCT Application No. PCT/KR2017/004543, filed Apr. 28, 2017, which claims priority to Korean Patent Application No. 10-2016-0053963, filed May 2, 2016, whose entire disclosures are hereby incorporated by reference.

TECHNICAL FIELD

An embodiment of the present invention relates to a lighting apparatus.

BACKGROUND ART

A light emitting diode (LED) is one of semiconductor devices configured to convert electric energy to light. The light emitting diode has advantages of low power consumption, a semi-permanent lifespan, a quick response speed, safety, and environmental friendliness in comparison with conventional light sources such as a fluorescent light, a light bulb, and the like. Accordingly, many studies for substituting the conventional light sources to light emitting diodes are being carried out.

Recently, use of the light emitting diode as a light source of a lighting apparatus such as various liquid crystal display devices, an electronic display board, a streetlight, or the like that are used indoors and outdoors is increasing. A lighting apparatus using the light emitting diode as the light source includes a light source member including a printed circuit board (PCB) on which the light emitting diode is mounted.

However, since luminance of an area which faces the light emitting diode is generally high in the lighting apparatus, luminance uniformity is difficult to improve.

DISCLOSURE

Technical Problem

The present invention is directed to providing a lighting apparatus in which luminance uniformity is improved.

Technical Solution

A lighting apparatus of an embodiment of the present invention includes a first body having an inner circumferential surface and an outer circumferential surface; a diffusion member disposed on the first body; a cover disposed on the first body to cover the diffusion member; a second body disposed between the diffusion member and the cover and including a lower surface and a side surface surrounding the lower surface; and a light source member including a first circuit board disposed on the lower surface of the second body, a second circuit board configured to surround the side surface of the second body, at least one first light source mounted on the first circuit board to face the diffusion member, and at least one second light source mounted on the second circuit board to face an inner side surface of the cover.

A lighting apparatus of another embodiment of the present invention includes a first body having an inner circumferential surface and an outer circumferential surface; a diffusion member disposed on the first body; a cover disposed on the first body to cover the diffusion member; a second body disposed between the diffusion member and the cover and having a convex shape protruding toward the diffusion member; and a light source member including a circuit board disposed on the outside of the second body and at least one light source mounted on the circuit board.

Advantageous Effects

A lighting apparatus of an embodiment of the present invention includes a light source member including: a first circuit board including at least one first light source mounted toward a light emitting direction of a diffusion member; and a second circuit board including at least one second light source mounted toward an edge of a cover. Accordingly, luminance uniformity of the lighting apparatus is improved and thus quality of the lighting apparatus can be improved.

MODES OF THE INVENTION

Since the present invention may be variously changed and have various embodiments, particular embodiments will be exemplified in the drawings and described. However, the present invention is not limited to the particular embodiment and includes all changes, equivalents, and substitutes falling within the spirit and the scope of the present invention.

Further, it should be understood that, although the terms "first," "second," and the like may be used herein to describe various elements, the elements are not limited by the terms. The terms are only used to distinguish one element from another. For example, a first element could be termed a second element, and similarly, a second element could be termed a first element without departing from the scope of the present invention. The term "and/or" includes combinations of one or all of a plurality of associated listed items.

When predetermined components are mentioned to be "linked," "coupled," or "connected" to other components, the components may be directly linked or connected to other components, but it should be understood that additional components may be "linked," "coupled," or "connected" therebetween. However, when the predetermined components are mentioned to be "linked," "coupled," or "connected" to other components, it should be understood that no additional components exist between the above-described components.

Terms used in the present invention are used solely to describe the particular embodiments and not to limit the present invention. The singular form is intended to also include the plural form, unless the context clearly indicates otherwise. It should be further understood that the terms "include," "including," "have," and/or "having" specify the presence of stated features, integers, steps, operations, elements, components, and/or groups thereof, but do not preclude the presence or addition of one or more other features, integers, steps, operations, elements, components, and/or groups thereof.

Unless otherwise defined, all terms including technical or scientific terms used in the present invention have meanings the same as those of terms generally understood by those skilled in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the embodiments will be described in detail with reference to the accompanying drawings, the same reference numerals are applied to the same or corresponding components regardless of the drawing numerals, and overlapping descriptions will be omitted.

Hereinafter, a lighting apparatus of an embodiment will be described below in detail with reference to the accompanying drawings.

Figure 1:
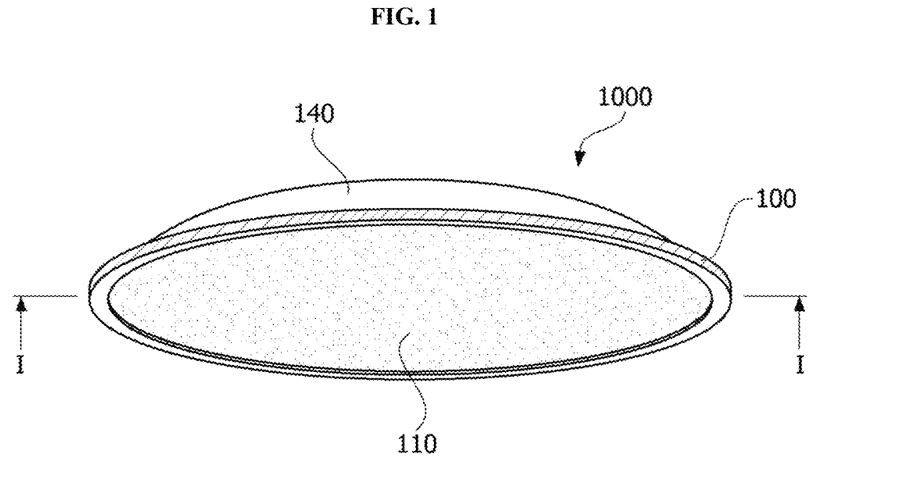
FIG. 1 is a lower perspective view of a lighting apparatus according to the present invention.
Figure 2A:
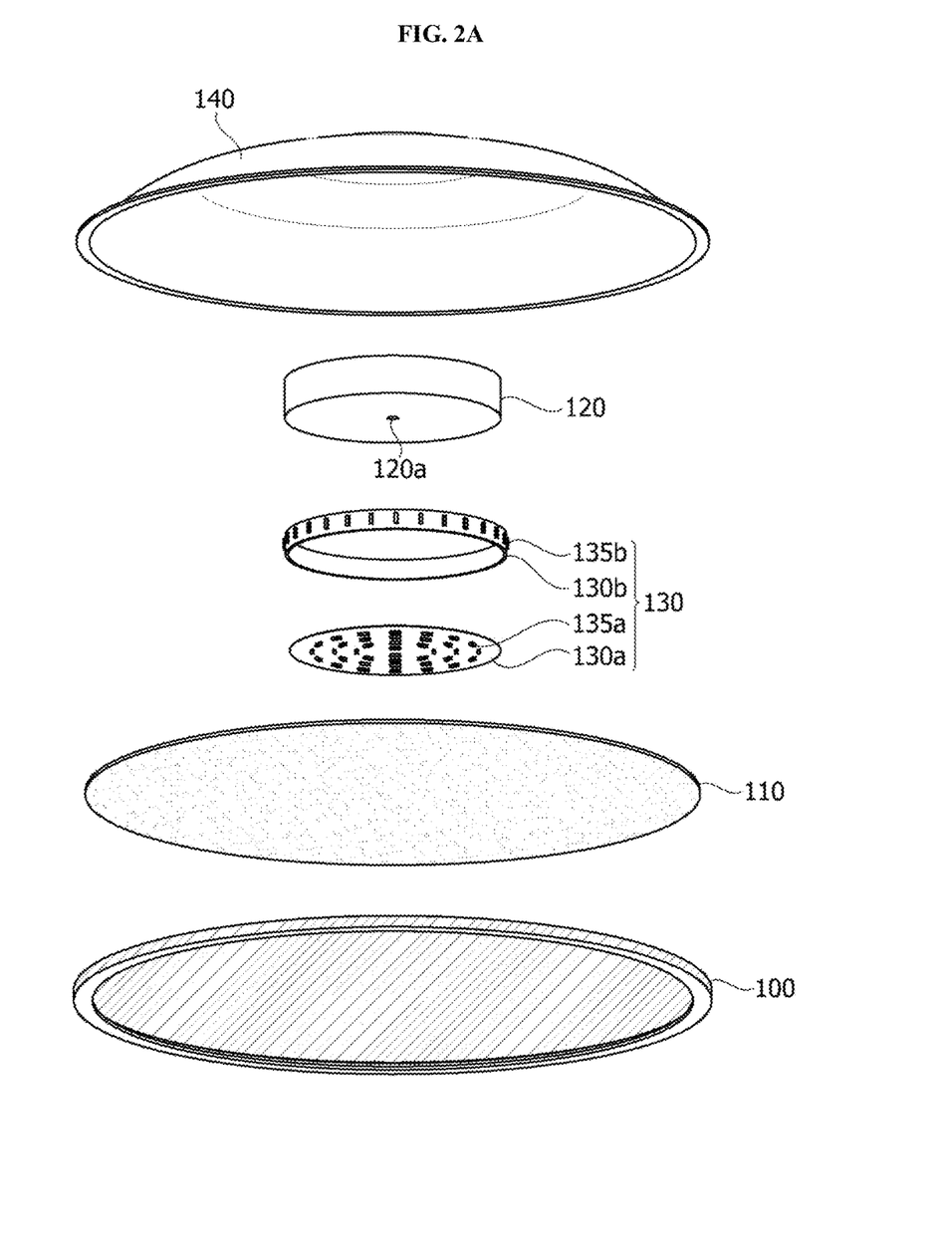
FIG. 2A is an exploded perspective view of FIG. 1 according to an embodiment of the present invention.
Figure 2B:
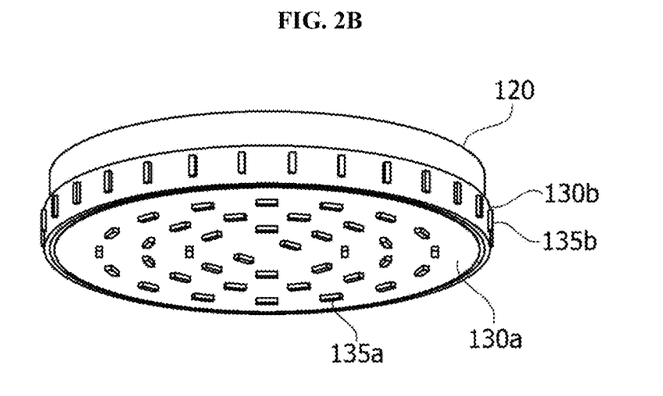
FIG. 2B is an expanded perspective view in which a second body and a light source member of FIG. 2A are engaged.
Figure 3A:
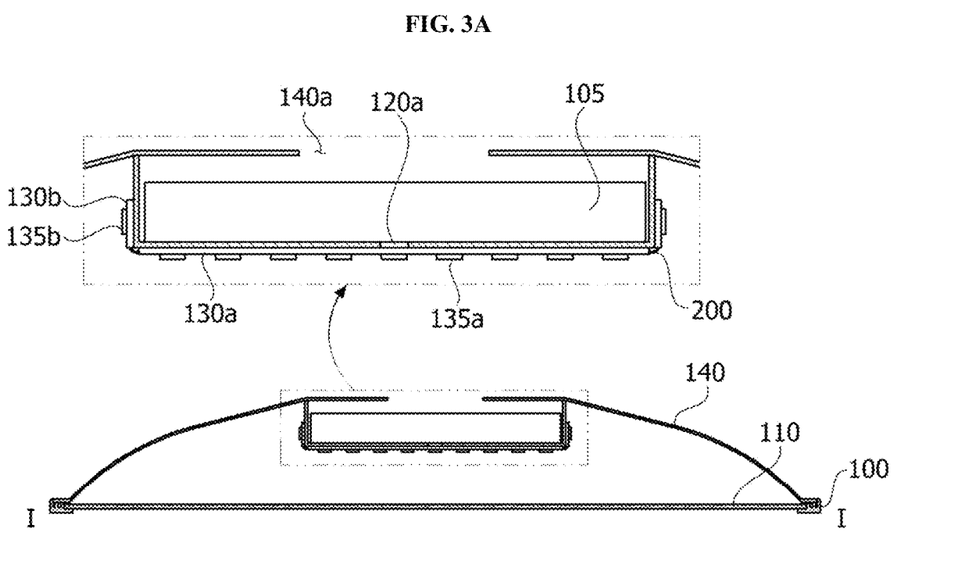
FIG. 3A is a cross-sectional view taken along line I-I' in FIG. 1 according to the embodiment of the present invention.

FIG. 1 is a lower perspective view of a lighting apparatus according to the present invention, FIG. 2A is an exploded perspective view of FIG. 1 according to an embodiment of the present invention, FIG. 2B is an expanded perspective view in which a second body and a light source member of FIG. 2A are engaged, and FIG. 3A is a cross-sectional view taken along line I-I' in FIG. 1 according to the embodiment of the present invention.

As shown in FIG. 1, FIG. 2A, FIG. 2B, and FIG. 3A, a lighting apparatus 1000 of the embodiment of the present invention includes a first body 100 having an inner circumferential surface and an outer circumferential surface, a diffusion member 110 disposed on the first body 100, a cover 140 disposed on the first body 100 to cover the diffusion member 110, a second body 120 disposed between the diffusion member 110 and the cover 140 and including a lower surface and a side surface surrounding the lower surface, and a light source member 130 including a first circuit board 130a disposed on the lower surface of the second body 120 and including at least one first light source 135a mounted to face the diffusion member 110, and a second circuit board 130b configured to surround an outer side surface of the second body 120 and including at least one second light source 135b mounted on the second circuit board 130b to face an inner side surface of the cover 140.

The first body 100 may have a ring shape having a first inner circumferential surface and a first outer circumferential surface. The first body may include an opening h, and the opening h may be located at a center of the first body. The first body 100 may be made of a plastic material and may be formed through an injection-molding method. For example, the first body 100 may include polycarbonate (PC). Further, when the first body 100 is made of the plastic material, the first body 100 may be lighter than a case in which the first body 100 is made of a metal material, and production costs may be reduced. However, a material of the first body 100 is not limited thereto.

The diffusion member 110 may be exposed through the opening h of the first body 100. An exposed area of the diffusion member 110 may be the same as an area of the opening h of the first body 100. The diffusion member 110 may be formed in a plate shape. Further, the diffusion member 110 may be coupled to the first inner circumferential surface of the first body 100. For example, an edge of the diffusion member 110 may be a shape which is seated on the first body 100. Accordingly, light generated from the light source member 130 may be diffused to be emitted to the outside through the diffusion member 110 exposed to a lower part of the first body 100.

The cover 140 may have a dome shape, the inside of which is concavely formed. Particularly, a first hole 140a may be formed in an upper surface of the cover 140. For example, external power may be supplied to the light source member 130 through the first hole 140a. Further, an edge of the cover 140 may be engaged with the first body 100. The edge of the cover 140 and the first body 100 may be engaged with each other through an engaging member such as a screw or the like and may be adhered to each other through an adhesive member, but the present invention is not limited thereto. The cover 140 may include a material having high reflectivity to reflect the light emitted from the light source member 130 to the diffusion member 110. For example, the cover 140 may include white silicone such as phenyl silicone and methyl silicone and may have a structure in which reflective particles are further included in the white silicone to improve reflectivity.

For example, the cover 140 may be glass in which TiO2 is dispersed, but is not limited thereto. Accordingly, the cover 140 may diffusively reflect the light emitted from the light source member 130 from the inner side surface thereof and may reflect the light incident on the cover 140 to the diffusion member 110 in a Lambertian distribution.

Further, the cover 140 may be formed of a material such as glass, plastic, polypropylene (PP), polyethylene (PE), polycarbonate (PC), or the like. In addition, a light reflective material such as silver (Ag), aluminum (Al) or the like may be additionally attached to the inner side surface of the cover 140 in an applying type, a coating type, a printing type, or a film type. The cover 140 is not limited thereto and may include various materials.

The second body 120 may be fixed to the inside of the cover 140 to be disposed between the cover 140 and the diffusion member 110. The second body 120 may be formed of a material the same as that of the first body 100, but may be formed of a material having excellent thermal conductivity such as aluminum (Al), copper (Cu), silver (Ag), gold (Au), or the like to serve as a heat sink.

The second body 120 may include the lower surface and the side surface surrounding the lower surface. A case in which the lower surface of the second body 120 has a circular shape and the second body 120 has a cylindrical shape is described in the drawing, and the shape of the lower surface of the second body 120 may be easily changed. Further, the lower surface of the second body 120 may face the diffusion member 110. In addition, the outer side surface of the second body 120 may face the inner side surface of the cover 140.

An upper surface of the second body 120 may have an open shape. For example, the upper surface of the second body 120 may have a structure in which an area overlapping the first hole 140a of the cover 140 is open, or an entire surface of the upper surface is open, as described above. Further, a power supply member 105 may be accommodated in the second body 120. For example, when the lighting apparatus of the embodiment of the present invention is fixed to a ceiling, the power supply member 105 may be connected to a power line installed on the ceiling through a socket (not shown) or the like.

When the power supply member 105 is inserted into the second body 120 as described above, since the power supply member 105 is not exposed to the outside of the lighting apparatus 1000, a whole thickness of the lighting apparatus 1000 may be decreased. Accordingly, the lighting apparatus may be minimized.

The power supply member 105 may include an alternating current (AC) to direct current (DC) converter configured to convert alternating current power supplied from the external power to direct current power, a driving chip configured to control driving of the light source member 130, an electrostatic discharge (ESD) protection device configured to protect the light source member 130, and the like, but is not limited thereto.

Further, the second body 120 may include a second hole 120a which passes through the lower surface of the second body 120 to electrically connect the power supply member 105 accommodated in the second body 120 and the light source member 130 disposed on the lower surface and the outer side surface of the second body 120. Particularly, when each of the first and second circuit boards 130a and 130b of the light source member 130 is a double-sided circuit board, an upper surface of the first circuit board 130a may be exposed by the second hole 120a. Further, the first circuit board 130a may be electrically connected to the power supply member 105 through the second hole 120a. In this case, the first circuit board 130a and the power supply member 105 may be electrically connected to each other using a conductive member such as a wire (not shown), but the conductive member is not limited thereto.

Further, when the first circuit board 130a is a single-sided circuit board, a third hole (not shown) which passes through the first circuit board 130a may be formed in the first circuit board 130a. In this case, the first circuit board 130a and the power supply member 105 may be electrically connected through the second hole 120a and the third hole (not shown).

The second circuit board 130b may be electrically connected to the first circuit board 130a through a conductive member 200 such as a wire or the like to receive power, but is not limited thereto. In this case, the first light source 135a and the second light source 135b may be driven at the same time.

Although not shown, a hole (not shown) which passes through the second body 120 is formed in the side surface of the second body 120, and thus the second circuit board 130b and the power supply member 105 may be directly connected to each other. In this case, since the first circuit board 130a and the second circuit board 130b are each independently connected to the power supply member 105, the first and second light sources 135a and 135b mounted on the first and second circuit boards 130a and 130b may be driven separately. Accordingly, one of the first light source 135a and the second light source 135b may be driven even when one of the first and second circuit boards 130a and 130b is electrically disconnected from the power supply member 105.

The first circuit board 130a and the second circuit board 130b may each be formed of polyethyleneterephthalate (PET), glass, polycarbonate (PC), silicon (Si), and the like, and may be printed circuit boards on which a plurality of first and second light sources 135a and 135b are mounted. Each of the first circuit board 130a and the second circuit board 130b may be formed in a film shape or selected from a single layer PCB, a multiple layer PCB, a ceramic board, a metal core PCB, etc.

The first circuit board 130a may have a plate shape, and the second circuit board 130b may have a ring shape surrounding the outer side surface of the second body 120. That is, the first circuit board 130a may be closely adhered to the lower surface of the second body 120, and the second circuit board 130b may be closely adhered to the outer side surface of the second body 120. Accordingly, the second circuit board 130b may be formed of a flexible circuit board so that adhesion between the second circuit board 130b and the second body 120 is improved. For example, the second circuit board 130b may be bent to surround the outer side surface of the second body 120.

At least one light source may be mounted on each of the first and second circuit boards 130a and 130b. The first light source 135a mounted on the first circuit board 130a and the second light source 135b mounted on the second circuit board 130b may be light emitting diode chips (LED chips). The light emitting diode chip may include a blue LED chip or an ultraviolet LED chip, or may include a package type in which at least one or more chips among a red LED chip, a green LED chip, a blue LED chip, a yellow green LED chip, and a white LED chip is combined.

Figure 3B:
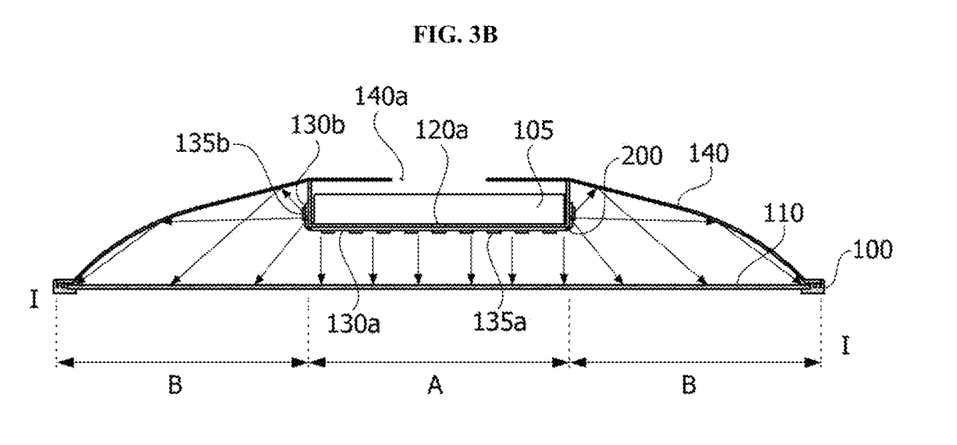
FIG. 3B is a cross-sectional view illustrating light emission of FIG. 3A.

FIG. 3B is a cross-sectional view illustrating light emission of FIG. 3A.

As shown in FIG. 3B, the first circuit board 130a may be disposed to face the diffusion member 110. For example, the first circuit board 130a may be located on the lower surface of the second body 120. Further, the first circuit board 130a may include at least one first light source 135a configured to face the diffusion member 110. Accordingly, light emitted from the first light source 135a may directly proceed to the diffusion member 110. Further, the second circuit board 130b may be disposed to face the inner side surface of the cover 140. For example, the second circuit board 130b may be located on the side surface of the second body 120. Further, the second circuit board 130b may include at least one second light source 135b configured to face the inner side surface of the cover 140. That is, some of light emitted from the second light source 135b may be reflected at the inner side surface of the cover 140 at least once to proceed to the diffusion member 110.

Accordingly, the diffusion member 110 of the lighting apparatus 1000 of the embodiment of the present invention may include a first light emission area A to which the light emitted from the first light source 135a is directly incident, and a second light emission area B on which the light emitted from the second light source 135b is incident to the diffusion member 110.

A general lighting apparatus may be driven in a direct type in which light sources are mounted to face a diffusion member, or an edge type in which the light sources are arranged to face each other in a cover. However, in the direct type, a luminance difference between an area which faces the light sources and an area which does not face the light sources is large. Further, in the edge type, since the light sources are only disposed on an edge portion of the lighting apparatus, a center of the lighting apparatus has lower luminance. In addition, a power-providing member disposed at the center of the lighting apparatus and a light source member disposed on the edge portion of the lighting apparatus are difficult to connect.

However, in the lighting apparatus of the embodiment of the present invention, since the light source member 130 is disposed to surround the lower surface and the outer side surface of the second body 120, and the power supply member 105 is disposed in the second body 120, the light source member 130 and the power supply member 105 may be easily connected. Further, since the first light source 135a serves as a direct type light source, and the second light source 135b serves as an edge type light source, luminance uniformity of the lighting apparatus may be improved.

Hereinafter, a lighting apparatus of another embodiment of the present invention will be specifically described.

Figure 4A:
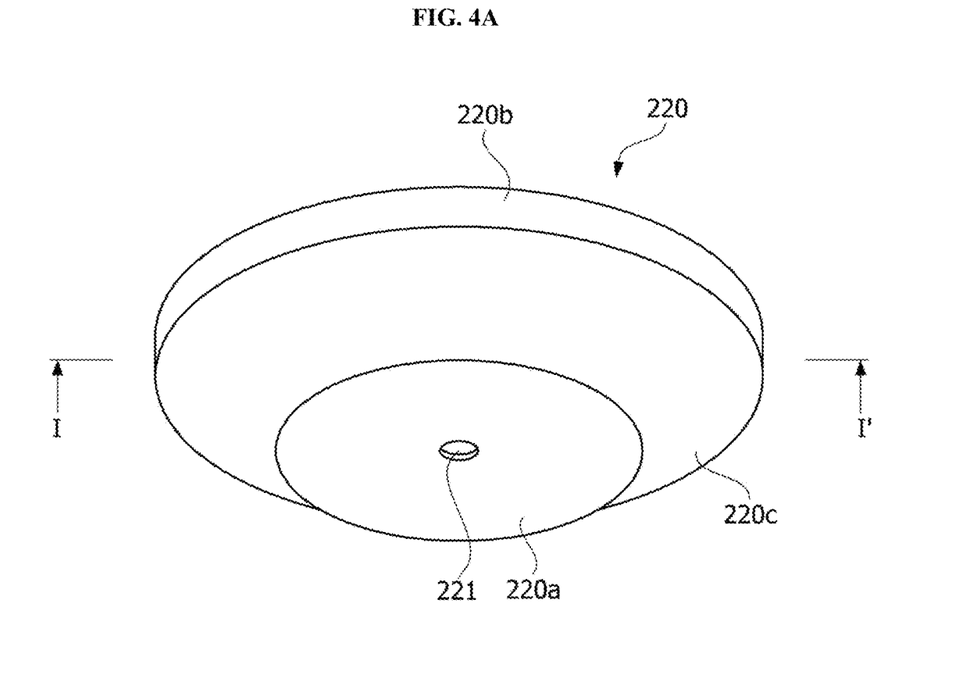
FIG. 4A is a perspective view of a second body according to another embodiment of the present invention.
Figure 4B:
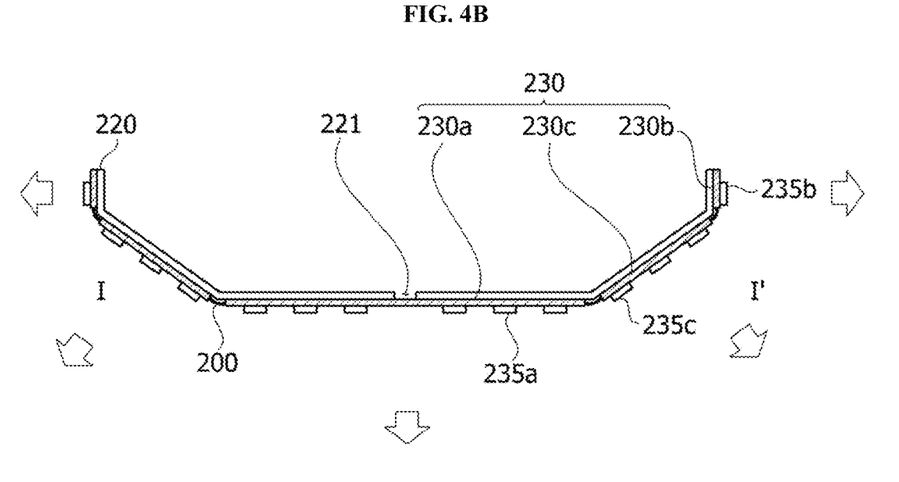
FIG. 4B is a cross-sectional view taken along line I-I' in FIG. 4A in which a light source member is engaged.
Figure 4C:
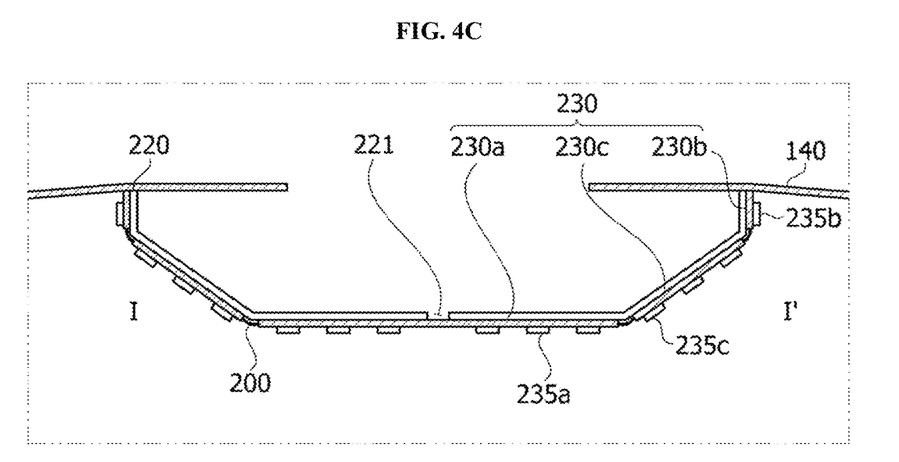
FIG. 4C is a cross-sectional view in which the second body having the light source member engaged therewith is disposed in a cover.

FIG. 4A is a perspective view of a second body of another embodiment of the present invention, and FIG. 4B is a cross-sectional view taken along line I-I' in FIG. 4A in which a light source member is engaged. Further, FIG. 4C is a cross-sectional view in which the second body having the light source member engaged therewith is disposed in a cover.

As shown in FIG. 4A, a second body 220 of another embodiment of the present invention may include a lower surface 220a including at least one second hole 221, a ring-shaped side surface 220b, and an inclined surface 220c configured to connect the lower surface 220a and the side surface 220b.

Accordingly, as shown in FIG. 4B, a light source member 230 disposed on an outer surface of the second body 220 may include a first circuit board 230a disposed on the lower surface 220a of the second body 220, a second circuit board 230b disposed on the side surface 220b of the second body 220, and a third circuit board 230c disposed on the inclined surface 220c of the second body 220. In this case, the second and third circuit boards 230b and 230c may each include a flexible circuit board and may be bent to surround the side surface 220b and the inclined surface 220c of the second body 220. Further, at least one light source 235a, 235b, and 235c may each be mounted on the circuit boards 230a, 230b, and 230c.

Further, the first circuit board 230a, the second circuit board 230b, and the third circuit board 230c may control the at least one light source 235a, 235b, and 235c disposed thereon using various methods.

For example, the lighting apparatus according to another embodiment may variously control light intensity. In a case of the greatest intensity, the at least one light source 235a, 235b, and 235c may be switched on the first circuit board 230a, the second circuit board 230b, and the third circuit board 230c to emit light.

Further, the light sources 235a, 235b, and 235c disposed on two circuit boards of the first circuit board 230a, the second circuit board 230b, and the third circuit board 230c may be switched on to emit light. In addition, when the light intensity of the lighting apparatus is weakened, the light sources 235a, 235b, and 235c disposed on one of the first circuit board 230a, the second circuit board 230b, and the third circuit board 230c may be switched on to emit light.

For example, when the light intensity of the light from the lighting apparatus is set to be weakest, only the light source 235b disposed on the third circuit board 230c may be switched on to emit light.

As described above, since one circuit board of the first circuit board 230a, the second circuit board 230b, and the third circuit board 230c is selectively controlled, power application to the light source may be adjusted, and accordingly, various light source intensities may be provided. Further, intensity and brightness of the light source may also be controlled in only one circuit board.

As described above, the lighting apparatus according to another embodiment may control types of the light sources disposed on the circuit boards and may control the light sources, to which the power is applied, to provide various moods. That is, emotional lighting control may be implemented in the lighting apparatus.

As shown in FIG. 4C, when the second body 220 is disposed in a cover 140 in the first light source 235a mounted on the first circuit board 230a, the emitted light may immediately proceed to the diffusion member (110 in FIG. 3A). Further, in the second light source 235b mounted on the second circuit board 230b, some of the emitted light may be reflected from an inner side surface of the cover 140 at least once to proceed to the diffusion member (110 in FIG. 3A). In addition, in the third light source 235c mounted on the third circuit board 230c, some of the light may be emitted to a space between the first light emission area A and the second light emission area B in FIG. 3B. In addition, in the third light source 235c, some of the light may overlap the first light emission area A and the second light emission area B.

Accordingly, in the lighting apparatus including the second body of another embodiment of the present invention, a luminance difference between the first light emission area A and the second light emission area B in FIG. 3B may be decreased.

Figure 5A:
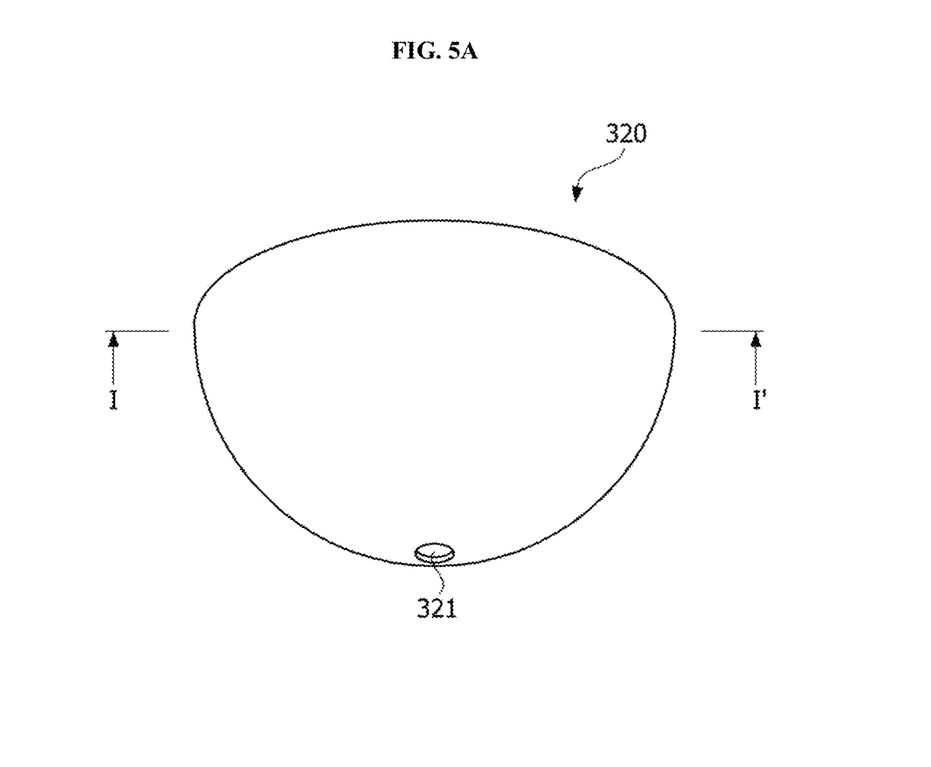
FIG. 5A is a perspective view of a second body according to still another embodiment of the present invention.
Figure 5B:
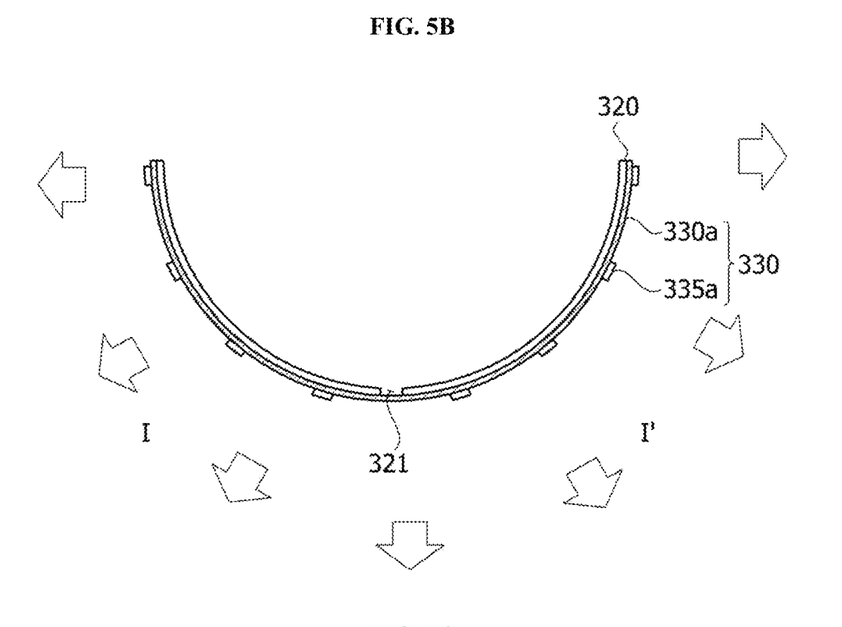
FIG. 5B is a cross-sectional view taken along line I-I' in FIG. 5A in which a light source member is engaged.
Figure 5C:
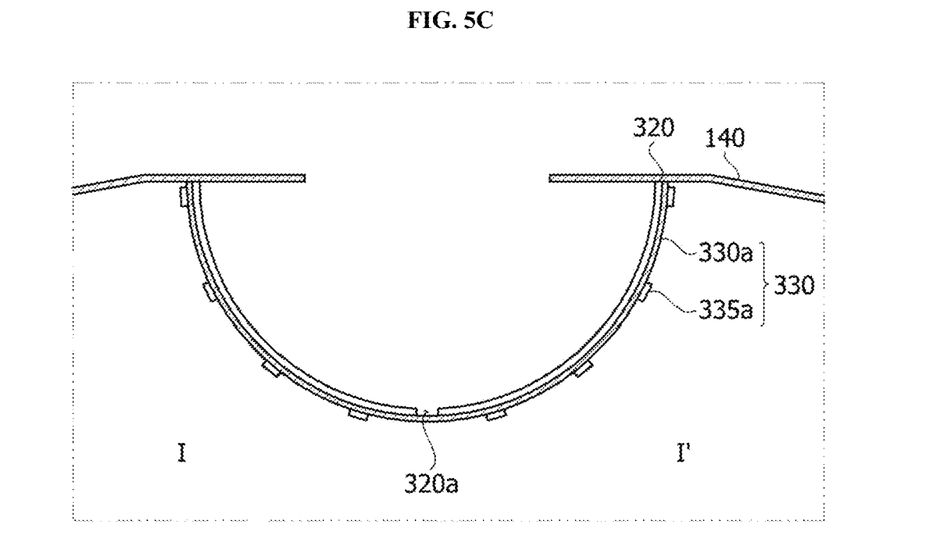
FIG. 5C is a cross-sectional view in which the second body having the light source member engaged therewith is disposed in a cover.

FIG. 5A is a perspective view of a second body of still another embodiment of the present invention, and FIG. 5B is a cross-sectional view taken along line I-I' in FIG. 5A in which a light source member is engaged. Further, FIG. 5C is a cross-sectional view in which the second body having the light source member engaged therewith is disposed in a cover.

As shown in FIG. 5A, a second body 320 of still another embodiment of the present invention may have a convex shape protruding in a direction toward a lower part on which a diffusion member (not shown) is disposed. Further, the second body 320 may include at least one second hole 321 passing therethrough.

As shown in FIG. 5B, a light source member 330 includes a flexible integrated circuit board 330a and may surround an outer side surface of the second body 320. Accordingly, as shown in FIG. 5C, when the second body 320 is disposed in a cover 140, light emitted from a light source 335a mounted on the circuit board 330a may uniformly proceed to a whole area of the diffusion member (110 in FIG. 3A).

As described above, the lighting apparatus of the embodiment of the present invention includes a light source member 130 including a first circuit board 130a including at least one first light source 135a mounted in a light emitting direction of the diffusion member 110 and a second circuit board 130b including at least one second light source 135b mounted toward the inner side surface of the cover 140. Accordingly, since the luminance uniformity of the lighting apparatus is improved, quality of the lighting apparatus may be improved.

As described above, the first circuit board 130a and the second circuit board 130b may be controlled to provide lighting strength, color, temperature in the second body of still another embodiment.

Additionally, in a case of the second body according to still another embodiment, the lighting apparatus may emit light to a desired area by applying power to the light source through only one of the first circuit board 130a and the second circuit board 130b.

As described above, the lighting apparatus according to the embodiment may control the types of the light sources disposed on the circuit board and the light sources, to which the power is applied, to perform the emotional lighting control which provides the various moods.

While the embodiments of the inventive concept have been described with reference to the accompanying drawings, it should be understood by those skilled in the art that various modifications may be made without departing from the scope of the inventive concept and without changing essential features thereof.

The invention claimed is:

1. A lighting apparatus comprising:
a first body having an inner circumferential surface and an outer circumferential surface;
a diffusion member disposed on the inner circumferential surface of the first body;
a cover disposed on the first body to cover the diffusion member, wherein the cover includes a first hole disposed on an upper surface of the cover;
a second body disposed between the diffusion member and the cover and including a lower surface, a side surface surrounding the lower surface, and an upper surface having an open shape, wherein the open shape of the upper surface is larger than the first hole of the cover; and
a light source member disposed on the outside of the second body,
wherein the light source member includes:
a first circuit board disposed on the lower surface of the second body;
a second circuit board configured to surround the side surface of the second body;
a first light source disposed on the first circuit board;
a second light source disposed on the second circuit board; and
a power supply member disposed above the lower surface of the second body and within a central area of the side surface of the second body, the power supply member is to receive external power through the first hole of the cover, the power supply member including an alternating current (AC) to direct current (DC) converter to convert alternating current power from the external power to direct current power,
wherein the second body includes a second hole passing through the lower surface of the second body, and the first circuit board is electrically connected to the power supply member through the second hole of the second body.

2. The lighting apparatus of claim 1, wherein the first circuit board and the second circuit board are electrically connected to each other through a conductive member.

3. The lighting apparatus of claim 2, wherein the first light source and the second light source are driven at the same time.

4. The lighting apparatus of claim 1, wherein the second circuit board includes a flexible circuit board.

5. The lighting apparatus of claim 1, wherein the first light source and the second light source are driven separately.

6. The lighting apparatus of claim 1, wherein:
the second body further includes an inclined surface configured to connect the lower surface and the side surface; and
a third circuit board disposed on the outside of the inclined surface and including a third light source is further disposed in the light source member.

7. The lighting apparatus of claim 1, wherein the first light source is configured to face the diffusion member.

8. The lighting apparatus of claim 1, wherein the second light source is configured to face an inner side surface of the cover.

9. The lighting apparatus of claim 1, wherein the diffusion member include a first light emission area through which light is incident from the first light source, and a second light emission area through which light is incident from the second light source.

10. The lighting apparatus of claim 1, wherein the diffusion member is coupled to the inner circumferential surface of the first body.

11. The lighting apparatus of claim 1, wherein the diffusion member has an edge disposed on the first body.

12. The lighting apparatus of claim 1, wherein the cover has an edge engaged with the first body.

13. The lighting apparatus of claim 1, wherein:
the first circuit board has a plate shape, and
the second circuit board has a ring shape.

14. The lighting apparatus of claim 1, wherein the first light source is disposed below the second light source.

* * * * *